United States Patent
Wang et al.

(10) Patent No.: US 11,588,209 B2
(45) Date of Patent: *Feb. 21, 2023

(54) ULTRA-THIN CERAMIC COATING ON SEPARATOR FOR BATTERIES

(71) Applicant: Applied Materials, Inc., Santa Clara, CA (US)

(72) Inventors: Connie P. Wang, Mountain View, CA (US); Wen Si, Xi'an (CN); Yin Let Sim, Singapore (SG); Torsten Dieter, Bad Soden Salmünster (DE); Roland Trassl, Giessen (DE); Subramanya P. Herle, Mountain View, CA (US); Christoph Daube, Alzenau (DE); Jian Zhu, Shanghai (CN); James Cushing, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/479,988

(22) PCT Filed: Aug. 21, 2018

(86) PCT No.: PCT/CN2018/101525
§ 371 (c)(1),
(2) Date: Jul. 23, 2019

(87) PCT Pub. No.: WO2020/037494
PCT Pub. Date: Feb. 27, 2020

(65) Prior Publication Data
US 2021/0328308 A1    Oct. 21, 2021

(51) Int. Cl.
*H01M 50/451* (2021.01)
*H01M 50/489* (2021.01)
*H01M 50/403* (2021.01)

(52) U.S. Cl.
CPC ....... *H01M 50/451* (2021.01); *H01M 50/403* (2021.01); *H01M 50/489* (2021.01)

(58) Field of Classification Search
CPC ............... H01M 50/40; H01M 50/449; H01M 50/403; H01M 50/451; H01M 50/489;
(Continued)

(56) References Cited

U.S. PATENT DOCUMENTS 5,208,121 A    5/1993 Yahnke et al.
5,238,759 A    8/1993 Plichta et al.
(Continued)

FOREIGN PATENT DOCUMENTS

CN    102127738 A    7/2011
CN    102405545 A    4/2012
(Continued)

OTHER PUBLICATIONS

Struller, et al., "Aluminum Oxide Barrier Layers on Polymer Web," 2012, 12 pages.
(Continued)

*Primary Examiner* — William E McClain
*Assistant Examiner* — Jason Barton
(74) *Attorney, Agent, or Firm* — Patterson + Sheridan, LLP

(57) ABSTRACT

Separators, high performance electrochemical devices, such as, batteries and capacitors, including the aforementioned separators, systems and methods for fabricating the same. In one implementation, a separator is provided. The separator comprises a polymer substrate (131), capable of conducting ions, having a first surface and a second surface opposing the first surface. The separator further comprises a first ceramic-containing layer (136), capable of conducting ions, formed on the first surface. The first ceramic-containing layer (136) has a thickness in arrange from about 1,000 nanometers to
(Continued)

about 5000 nanometers. The separator further comprises a second ceramic-containing layer (138), capable of conducting ions, formed on the second surface. The second ceramic-containing layer (138) is a binder-free ceramic-containing layer and has a thickness in arrange from about 1 nanometer to about 1,000 nanometers.

20 Claims, 7 Drawing Sheets

(58) Field of Classification Search
CPC ............ H01M 50/409; H01M 50/434; H01M 50/457; C25D 5/00
See application file for complete search history.

(56) References Cited

U.S. PATENT DOCUMENTS

| | | | |
|---|---|---|---|
| 5,342,709 A | 8/1994 | Yahnke et al. | |
| 5,656,391 A | 8/1997 | Hambitzer et al. | |
| 5,705,292 A | 1/1998 | Kukita et al. | |
| 5,948,464 A | 9/1999 | Delnick | |
| 5,961,672 A | 10/1999 | Skotheim et al. | |
| 6,153,337 A | 11/2000 | Carlson et al. | |
| 6,183,901 B1 | 2/2001 | Ying et al. | |
| 6,194,098 B1 | 2/2001 | Ying et al. | |
| 6,277,514 B1 | 8/2001 | Ying et al. | |
| 6,306,545 B1 | 10/2001 | Carlson et al. | |
| 6,432,586 B1 | 8/2002 | Zhang | |
| 7,066,971 B1 | 6/2006 | Carlson | |
| 7,385,801 B2 | 6/2008 | Ando et al. | |
| 7,662,510 B2 | 2/2010 | Zhang | |
| 7,666,233 B2 | 2/2010 | Visco et al. | |
| 7,754,015 B2 | 7/2010 | Sasaki et al. | |
| 7,928,411 B2 | 4/2011 | Klemm et al. | |
| 8,017,262 B2 | 9/2011 | Fujikawa et al. | |
| 8,142,920 B2 | 3/2012 | Hennige et al. | |
| 8,182,948 B2 | 5/2012 | He et al. | |
| 8,202,649 B2 | 6/2012 | Visco et al. | |
| 8,372,475 B2 | 2/2013 | Kim et al. | |
| 8,394,535 B2 | 3/2013 | Kobori et al. | |
| 8,394,536 B2 | 3/2013 | Kobori et al. | |
| 8,425,738 B2 | 4/2013 | Hoffman et al. | |
| 8,470,468 B2 | 6/2013 | Xiao et al. | |
| 8,518,582 B2 | 8/2013 | Park et al. | |
| 8,535,826 B2 | 9/2013 | Jeong et al. | |
| 8,591,223 B2 | 11/2013 | Hein et al. | |
| 8,597,819 B2 | 12/2013 | Hennige et al. | |
| 8,663,730 B1 | 3/2014 | Lahiri et al. | |
| 8,691,419 B2 | 4/2014 | Lee et al. | |
| 9,065,122 B2 | 6/2015 | Orilall et al. | |
| 9,142,833 B2 | 9/2015 | Tolbert et al. | |
| 9,287,540 B2 | 3/2016 | Huang | |
| 9,356,271 B2 | 5/2016 | Ramasubramanian et al. | |
| 9,508,976 B2 | 11/2016 | Herle | |
| 9,548,486 B2 | 1/2017 | Abe et al. | |
| 9,653,750 B2 | 5/2017 | Laramie et al. | |
| 9,660,310 B2 | 5/2017 | Mak et al. | |
| 9,711,772 B2 | 7/2017 | Yoo et al. | |
| 9,748,544 B2 | 8/2017 | Joshi | |
| 10,173,921 B2 | 1/2019 | Aitken et al. | |
| 10,193,116 B2 | 1/2019 | Herle et al. | |
| 10,411,238 B2* | 9/2019 | Herle ................... | H01M 4/405 |
| 10,490,796 B2 | 11/2019 | Laramie et al. | |
| 2004/0106037 A1 | 6/2004 | Cho et al. | |
| 2007/0281206 A1 | 12/2007 | Fujikawa et al. | |
| 2009/0110807 A1 | 4/2009 | Koenig | |
| 2010/0216026 A1 | 8/2010 | Lopatin et al. | |
| 2011/0200863 A1 | 8/2011 | Xiao et al. | |
| 2012/0251890 A1 | 10/2012 | Pascaly et al. | |
| 2012/0301774 A1 | 11/2012 | Jiang et al. | |
| 2013/0199030 A1 | 8/2013 | Song et al. | |
| 2013/0260184 A1 | 10/2013 | Yu et al. | |
| 2013/0260208 A1 | 10/2013 | Cho et al. | |
| 2013/0337312 A1 | 12/2013 | Park et al. | |
| 2014/0045033 A1 | 2/2014 | Zhang et al. | |
| 2014/0072884 A1 | 3/2014 | Zhang et al. | |
| 2014/0133068 A1 | 5/2014 | Iwai et al. | |
| 2014/0212727 A1 | 7/2014 | Hying et al. | |
| 2014/0227443 A1 | 8/2014 | Hoffmann et al. | |
| 2014/0227455 A1 | 8/2014 | Hoffmann et al. | |
| 2014/0272524 A1 | 9/2014 | Visco et al. | |
| 2014/0322587 A1 | 10/2014 | Lai et al. | |
| 2014/0335395 A1 | 11/2014 | Ramasubramanian et al. | |
| 2015/0064576 A1 | 3/2015 | Aitken et al. | |
| 2015/0132633 A1 | 5/2015 | Joshi | |
| 2015/0140404 A1 | 5/2015 | Yoo et al. | |
| 2015/0236320 A1 | 8/2015 | Laramie et al. | |
| 2015/0236322 A1 | 8/2015 | Laramie et al. | |
| 2015/0325828 A1 | 11/2015 | Herle et al. | |
| 2017/0025658 A1* | 1/2017 | Shi ..................... | H01M 50/431 |
| 2017/0062788 A1* | 3/2017 | Herle .................. | H01M 50/449 |
| 2018/0102526 A1 | 4/2018 | Herle | |

FOREIGN PATENT DOCUMENTS

| | | |
|---|---|---|
| CN | 102407623 A | 4/2012 |
| CN | 102629676 A | 8/2012 |
| CN | 104269508 A | 1/2015 |
| CN | 105161661 A | 12/2015 |
| CN | 105895844 A | 8/2016 |
| CN | 106207059 A | 12/2016 |
| CN | 106575720 A | 4/2017 |
| CN | 106887556 A | 6/2017 |
| CN | 107210412 A | 9/2017 |
| CN | 107710453 A | 2/2018 |
| CN | 108140784 A | 6/2018 |
| EP | 0761726 A2 | 3/1997 |
| EP | 1146576 A1 | 10/2001 |
| EP | 3304617 A1 | 4/2018 |
| JP | 2004158453 A | 6/2004 |
| JP | 2005196999 A | 7/2005 |
| JP | 2011113915 A | 6/2011 |
| JP | 2017533547 A | 11/2017 |
| JP | 2018523263 A | 8/2018 |
| KR | 20150026553 A | 3/2015 |
| KR | 20180006494 A | 1/2018 |
| KR | 20180024022 A | 3/2018 |
| WO | 2010/093368 A1 | 8/2010 |
| WO | 2012050406 A2 | 4/2012 |
| WO | 2012146312 A1 | 11/2012 |
| WO | 2014093519 A1 | 6/2014 |
| WO | 2017160897 A1 | 9/2017 |
| WO | 2017/172880 A1 | 10/2017 |

OTHER PUBLICATIONS

Kim, et al., "Surface-Modified Membrane as a Separator for Lithium-Ion Polymer Battery," Energies, 2010, 3, pp. 866-885.
Zhang, "A Review on the Separators of Liquid Electrolyte Li-Ion Batteries," Journal of Power Sources, 164 (2007) pp. 351-364.
Lee, et al., "A Review of Recent Developments in Membrane Separators for Rechargeable Lithium-Ion Batteries," Royal Society of Chemistry, Energy and Environmental Science, Aug. 18, 2014, 30 pp.
Zhang, et al., "Superior Conductive Solid-like Electrolytes: Nanoconfining Liquids Within the Hollow Structures," Nano cetters, 2015, 15 (5) Apr. 6, 2015, 5 pages.
Choi, et al., "Enhancement of Thermal Stability and Cycling Performance in Lithium-Ion Cells through the Use of Ceramic-Coated Separators," Journal of Power Sources 195 (2010), 5 pages.
Lee, et al., "Effect of Al2O3 Coatings Prepared by RF Sputtering on Polyethylene Separators for High-Power Lithium on Batteries," Macromolecular Research, 2014, vol. 22, No. 11, pp. 1190-1195.
International Search Report and Written Opinion for International Application No. PCT/US2016/034579 (APPM/023038PCT) dated Aug. 24, 2016.
Office Action for U.S. Appl. No. 14/937,442 {APPM/023038US) dated Mar. 10, 2016.
Suo, et al., "A New Class of Solvent-in-Salt Electrolyte for High-Energy Rechargeable Metallic Lithium Batteries," Nature Communications, Feb. 12, 2013, 9 pp.

(56) References Cited

OTHER PUBLICATIONS

Yoo, et al., "Initiated Chemical Vapor Deposition (iCVD) of Highly Cross-Linked Polymer Films for Advanced Lithiumon Battery Separators," ACS Applied Materials & Interfaces 2015, 7, pp. 18849-18855.
Novak, et al., "Study of Surface Properties of Polyolefins Modified by Corona Discharge Plasma," Plasma Processes and Polymers, 2006, 3, pp. 355-364.
Shin, et al., "Composite Gel Electrolytes for Suppressing Lithium Dendrite Growth and Improving Cycling Performance of LiNi0.5Mn1.5O4 Electrodes," Journal of The Electrochemical Society, 162 (14), 2015, pp. A2628-A2634.
Evonik Industries, "Growth Drivers in Our Portfolio: Lithium-ion Battery Components," Jun. 2009, 4 pp.
International Search Report and Written Opinion for Application No. PCT/CN2018/101525 dated May 13, 2019.
Extended European Search Report dated Feb. 25, 2022 for Application No. 18931154.1.
Japanese Office Action dated Mar. 29, 2022 for Application No. 2021-509775.
Chinese Office Action dated Aug. 3, 2022 for Application No. 201880096340.5.
Korean Office Action dated Oct. 5, 2022 for Application No. 10-2021-7008252.
Japanese Office Action dated Dec. 20, 2022 for Application No. 2021-509775.

* cited by examiner

ULTRA-THIN CERAMIC COATING ON SEPARATOR FOR BATTERIES

BACKGROUND

Field

Implementations of the present disclosure generally relate to separators, high performance electrochemical devices, such as batteries and capacitors, including the aforementioned separators, systems and methods for fabricating the same.

Description of the Related Art

Fast-charging, high-capacity energy storage devices, such as capacitors and lithium-ion (Li-ion) batteries, are used in a growing number of applications, including portable electronics, medical, transportation, grid-connected large energy storage, renewable energy storage, and uninterruptible power supply (UPS).

Li-ion batteries typically include an anode electrode, a cathode electrode, and a separator positioned between the anode electrode and the cathode electrode. The separator is an electronic insulator, which provides physical and electrical separation between the cathode and the anode electrodes. The separator is typically made from micro-porous polyethylene and polyolefin. During electrochemical reactions, for example, charging and discharging, lithium ions are transported through the pores in the separator between the two electrodes via an electrolyte. Thus, high porosity helps increase ionic conductivity. However, some high porosity separators are susceptible to electrical shorts when lithium dendrites formed during cycling create shorts between the electrodes.

Currently, battery cell manufacturers purchase separators, which are then laminated together with anode and cathode electrodes in separate processing steps. Other separators are typically made by wet or dry extrusion of a polymer and then stretched to produce holes (tears) in the polymer material. The separator is generally one of the most expensive components in the Li-ion battery and accounts for over 20% of the material cost in battery cells.

For most energy storage applications, the charge time and capacity of energy storage devices are parameters of interest. In addition, the size, weight, and/or expense of such energy storage devices can be significant limitations. The use of currently available separators has a number of drawbacks. Namely, such available materials limit the minimum size of the electrodes constructed from such materials, suffer from electrical shorts, involve complex manufacturing methods, and expensive materials. Further, current separator designs often suffer from lithium dendrite growth, which may lead to short-circuits.

Accordingly, there is a need in the art for faster charging, higher capacity energy storage devices with separators that are smaller, lighter, and can be more cost effectively manufactured.

SUMMARY

Implementations of the present disclosure generally relate to separators, high performance electrochemical devices, such as, batteries and capacitors, including the aforementioned separators, systems and methods for fabricating the same. In one implementation, a separator is provided. The separator comprises a polymer substrate, capable of conducting ions, having a first surface and a second surface opposing the first surface. The separator further comprises a first ceramic-containing layer, capable of conducting ions, formed on the first surface. The first ceramic-containing layer has a thickness in a range from about 1,000 nanometers to about 5,000 nanometers. The separator further comprises a second ceramic-containing layer, capable of conducting ions, formed on the second surface. The second ceramic-containing layer is a binder-free ceramic-containing layer and has a thickness in a range from about 1 nanometer to about 1,000 nanometers.

In another implementation, a battery is provided. The battery comprises an anode containing at least one of lithium metal, lithium-alloy, graphite, silicon-containing graphite, nickel, copper, tin, indium, silicon, or combinations thereof. The battery further comprises a cathode. The battery further comprises a separator disposed between the anode and the cathode. The separator comprises a polymer substrate, capable of conducting ions, having a first surface and a second surface opposing the first surface. The separator further comprises a first ceramic-containing layer, capable of conducting ions, formed on the first surface. The first ceramic-containing layer has a thickness in a range from about 1,000 nanometers to about 5,000 nanometers. The separator further comprises a second ceramic-containing layer, capable of conducting ions, formed on the second surface. The second ceramic-containing layer is a binder-free ceramic-containing layer and has a thickness in a range from about 1 nanometer to about 1,000 nanometers.

In yet another implementation, a method of forming a separator for a battery is provided. The method comprises exposing a material to be deposited on a microporous ion-conducting polymeric layer positioned in a processing region to an evaporation process. The microporous ion-conducting polymeric layer has a first surface, a second surface opposing the first surface, and a first ceramic-containing layer, capable of conducting ions, formed on the first surface. The first ceramic-containing layer has a thickness in a range from about 1,000 nanometers to about 5,000 nanometers. The method further comprises reacting the evaporated material with a reactive gas and/or plasma to deposit a second ceramic-containing layer, capable of conducting ions, on the second surface of the microporous ion-conducting polymeric layer. The second ceramic-containing layer is a binder-free ceramic-containing layer and has a thickness in a range from about 1 nanometer to about 1,000 nanometers.

In yet another implementation, a method of forming a separator for a battery is provided. The method comprises exposing a first material to be deposited on a microporous ion-conducting polymeric layer positioned in a processing region to an evaporation process. The microporous ion-conducting polymeric layer has a first surface, a second surface opposing the first surface, and a first ceramic-containing layer, capable of conducting ions, formed on the first surface. The first ceramic-containing layer has a thickness in a range from about 1,000 nanometers to about 5,000 nanometers. The method further comprises reacting the evaporated first material with a reactive gas and/or plasma to deposit a second ceramic-containing layer, capable of conducting ions, on the second surface of the microporous ion-conducting polymeric layer. The second ceramic-containing layer is a binder-free ceramic-containing layer and has a thickness in a range from about 1 nanometer to about 100 nanometers. The method further comprises exposing the microporous ion-conducting polymeric layer to a first cooling process. The method further comprises reacting an evaporated second material with a reactive gas and/or plasma to deposit a third ceramic-containing layer, capable of conducting ions, on the second ceramic-containing layer. The third ceramic-containing layer is a binder-free ceramic-containing layer and has a thickness in a range from about 1 nanometer to about 100 nanometers.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
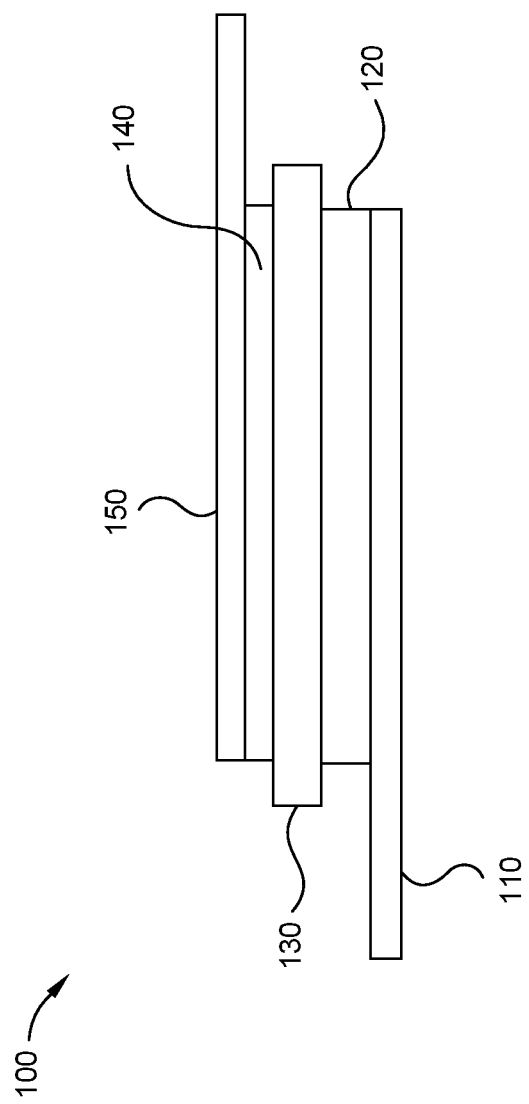
FIG. 1 illustrates a cross-sectional view of one implementation of a cell structure formed according to one or more implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes separators, high performance electrochemical cells and batteries including the aforementioned separators, systems and methods for fabricating the same. Certain details are set forth in the following description and in FIGS. 1-6C to provide a thorough understanding of various implementations of the disclosure. Other details describing well-known structures and systems often associated with electrochemical cells and batteries are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a high rate evaporation process that can be carried out using a roll-to-roll coating system, such as TopMet™, SmartWeb™, TopBeam™ all of which are available from Applied Materials, Inc. of Santa Clara, Calif. Other tools capable of performing high rate evaporation processes may also be adapted to benefit from the implementations described herein. In addition, any system enabling high rate evaporation processes described herein can be used to advantage. The apparatus description described herein is illustrative and should not be construed or interpreted as limiting the scope of the implementations described herein. It should also be understood that although described as a roll-to-roll process, the implementations described herein may be performed on discrete polymer substrates.

The currently available generation of batteries, especially Li-ion batteries, use porous polymer separators, which are susceptible to thermal shrinkage and may short-circuit between positive and negative electrodes or the corresponding current collectors. A ceramic coating on the separator helps to inhibit direct contact between electrodes and helps to prevent potential dendrite growth associated with lithium metal. Current state of the art ceramic coating is performed using wet coating (e.g., slot-die techniques) of ceramic particles dispersed in a polymeric binder to make the composite and a solvent is used to make the slurry. The thickness of the ceramic coating is normally around three microns including randomly oriented dielectric material bound together by a polymer leading to a random pore structure. The existing ceramic particle coating method has difficulty in reducing tortuosity due to this random orientation of ceramic particles. Further, it is difficult to reduce the thickness of current ceramic coatings using current wet coating methods. In order to compensate for the increased surface area of finer ceramic powder particles current wet coating methods involve increased amounts of both binder and solvent to decrease the viscosity of the slurry. Thus, the current wet coating methods suffer from several problems.

From a manufacturing standpoint, ceramic coating via dry methods is ideal from both a cost and performance point of view. However, dry methods such as physical vapor deposition (PVD) are performed at elevated processing temperatures. Elevated processing temperatures in combination with the decreasing thickness of polymer separators leads to heat induced damage such as melting or creating wrinkles in the polymer separator. In addition, thinner polymer separators often lack the mechanical integrity for current roll-to-roll processing systems.

In the present disclosure, a thin polymer separator stack is provided. The thin polymer separator stack includes an ultra-thin ceramic-coating formed on a first side of front side of the thin polymer separator, which suppresses thermal shrinkage while maintaining the desired ionic conductivity. The ultra-thin ceramic-coating may be deposited using PVD techniques at elevated temperatures. The ultra-thin ceramic coating may have a thickness in a range from about 0.05 to about 0.5 microns. The thin polymer separator stack further includes a thick ceramic coating formed on a second side or backside of the of the thin polymer separator, which provides mechanical stability while maintaining the desired ionic conductivity. The thick ceramic coating may be deposited using wet-coating techniques. The thick ceramic coating may have a thickness in a range from about 1 micron to about 5 microns. Thus, the thin polymer separator stack includes the benefit of reduced thermal shrinkage with improved mechanical stability while maintaining desired ionic conductivity at a decreased separator thickness (e.g., 12 microns or less).

FIG. 1 illustrates an example of a cell structure 100 having a ceramic-coated separator according to implementations of the present disclosure. The cell structure 100 has a positive current collector 110, a positive electrode 120, a ceramic-coated separator 130, a negative electrode 140 and a negative current collector 150. Note in FIG. 1 that the current collectors are shown to extend beyond the stack, although it is not necessary for the current collectors to extend beyond the stack, the portions extending beyond the stack may be used as tabs. The cell structure 100, even though shown as a planar structure, may also be formed into a cylinder by rolling the stack of layers; furthermore, other cell configurations (e.g., prismatic cells, button cells) may be formed.

The current collectors 110, 150, on the positive electrode 120 and the negative electrode 140, respectively, can be identical or different electronic conductors. Examples of metals that the current collectors 110, 150 may be comprised of include aluminum (Al), copper (Cu), zinc (Zn), nickel (Ni), cobalt (Co), tin (Sn), silicon (Si), manganese (Mn), magnesium (Mg), alloys thereof, and combinations thereof. In one implementation, the current collector 110 comprises aluminum and the current collector 150 comprises copper.

The negative electrode 140 or anode may be any material compatible with the positive electrode 120. The negative electrode 140 may have an energy capacity greater than or equal to 372 mAh/g, preferably ≥700 mAh/g, and most preferably ≥1,000 mAh/g. The negative electrode 140 may be constructed from a graphite, silicon-containing graphite (e.g., silicon (<5%) blended graphite), a lithium metal foil or a lithium alloy foil (e.g. lithium aluminum alloys), or a mixture of a lithium metal and/or lithium alloy and materials such as carbon (e.g. coke, graphite), nickel, copper, tin, indium, silicon, oxides thereof, or combinations thereof.

The positive electrode 120 or cathode may be any material compatible with the anode and may include an intercalation compound, an insertion compound, or an electrochemically active polymer. Suitable intercalation materials include, for example, lithium-containing metal oxides, $MoS_2$, $FeS_2$, $MnO_2$, $TiS_2$, $NbSe_3$, $LiCoO_2$, $LiNiO_2$, $LiMnO_2$, $LiMn_2O_4$, $V_6O_{13}$ and $V_2O_5$. Suitable lithium-containing oxides include layered, such as lithium cobalt oxide ($LiCoO_2$), or mixed metal oxides, such as $LiNi_xCo_{1-2x}MnO_2$, $LiNiMnCoO_2$ ("NMC"), $LiNi_{0.5}Mn_{1.5}O_4$, $Li(Ni_{0.8}Co_{0.15}Al_{0.05})O_2$, $LiMn_2O_4$, and doped lithium rich layered-layered materials, wherein x is zero or a non-zero number. Suitable phosphates include iron olivine ($LiFePO_4$) and it's variants (such as $LiFe_{(1-x)}Mg_xPO_4$), $LiMoPO_4$, $LiCoPO_4$, $LiNiPO_4$, $Li_3V_2(PO_4)_3$, $LiVOPO_4$, $LiMP_2O_7$, or $LiFe_{1.5}P_2O_7$, wherein x is zero or a non-zero number. Suitable fluorophosphates include $LiVPO_4F$, $LiAlPO_4F$, $Li_5V(PO_4)_2F_2$, $Li_5Cr(PO_4)_2F_2$, $Li_2CoPO_4F$, or $Li_2NiPO_4F$. Suitable silicates may be $Li_2FeSiO_4$, $Li_2MnSiO_4$, or $Li_2VOSiO_4$. An exemplary non-lithium compound is $Na_5V_2(PO_4)_2F_3$.

Electrolytes infused in cell components 120, 130 and 140 can be comprised of a liquid/gel or a solid polymer and may be different in each. Any suitable electrolyte may be used. In some implementations, the electrolyte primarily includes a salt and a medium (e.g., in a liquid electrolyte, the medium may be referred to as a solvent; in a gel electrolyte, the medium may be a polymer matrix). The salt may be a lithium salt. The lithium salt may include, for example, $LiPF_6$, $LiAsF_6$, $LiCF_3SO_3$, $LiN(CF_3SO_3)_3$, $LiBF_6$, and $LiClO_4$, BETTE electrolyte (commercially available from 3M Corp. of Minneapolis, Minn.) and combinations thereof.

Figure 2:
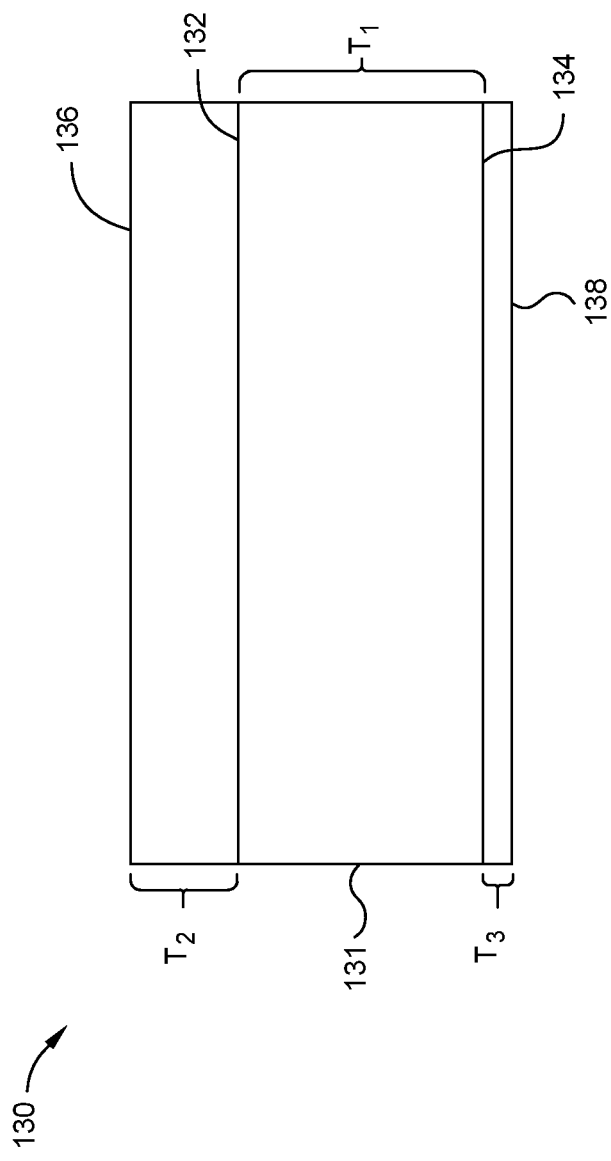
FIG. 2 illustrates a cross-sectional view of a ceramic-coated separator formed according to one or more implementations described herein.

FIG. 2 illustrates a cross-sectional view of the ceramic-coated separator 130 formed according to one or more implementations described herein. The ceramic-coated separator 130 includes a porous (e.g., microporous) polymeric substrate 131 capable of conducting ions (e.g., a separator film). The porous polymeric substrate 131 has a first surface 132 and a second surface 134 opposite the first surface 132. A first ceramic-containing layer 136, capable of conducting ions, is formed on at least a portion of the first surface 132 of the porous polymeric substrate 131. A second ceramic-containing layer 138 (e.g., ultra-thin ceramic coating), capable of conducting ions, is formed on at least a portion of the second surface 134 of the porous polymeric substrate 131. The first ceramic-containing layer 136 has a thickness greater than a thickness of the second ceramic-containing layer 138.

In some implementations, the porous polymeric substrate 131 does not need to be ion-conducting, however, once filled with electrolyte (liquid, gel, solid, combination etc.), the combination of porous substrate and electrolyte is ion-conducting. The first ceramic-containing layer 136 and the second ceramic-containing layer 138 are, at least, adapted for preventing electronic shorting (e.g. direct or physical contact of the anode and the cathode) and blocking dendrite growth. The porous polymeric substrate 131 may be, at least, adapted for blocking (or shutting down) ionic conductivity (or flow) between the anode and the cathode during the event of thermal runaway. The first ceramic-containing layer 136 and the second ceramic-containing layer 138 of the ceramic-coated separator 130 should be sufficiently conductive to allow ionic flow between the anode and cathode, so that the cell structure 100 generates current in desired quantities. As discussed herein, in one implementation, the second ceramic-containing layer 138 is formed on the porous polymeric substrate 131 using evaporation techniques.

In one implementation, the porous polymeric substrate 131 is a microporous ion-conducting polymeric substrate. In one implementation, the porous polymeric substrate 131 is a multi-layer polymeric substrate. In some implementations, the porous polymeric substrate 131 is selected from any commercially available polymeric microporous membranes (e.g., single or multi-ply), for example, those products produced by produced by Polypore (Celgard Inc., of Charlotte, N.C.), Toray Tonen (Battery separator film (BSF)), SK Energy (lithium ion battery separator (LiBS), Evonik industries (SEPARION® ceramic separator membrane), Asahi Kasei (Hipore™ polyolefin flat film membrane), DuPont (Energain®), etc. In some implementations, the porous polymeric substrate 131 has a porosity in the range of 20 to 80% (e.g., in the range of 28 to 60%). In some implementations, the porous polymeric substrate 131 has an average pore size in the range of 0.02 to 5 microns (e.g., 0.08 to 2 microns). In some implementations, the porous polymeric substrate 131 has a Gurley Number in the range of 15 to 150 seconds (Gurley Number refers to the time it takes for 10 cc of air at 12.2 inches of water to pass through one square inch of membrane). In some implementations, the porous polymeric substrate 131 comprises a polyolefin polymer. Examples of suitable polyolefin polymers include polypropylene, polyethylene, or combinations thereof. In some implementations, the porous polymeric substrate 131 is a polyolefinic membrane. In some implementation, the polyolefinic membrane is a polyethylene membrane or a polypropylene membrane.

In one implementation, the porous polymeric substrate 131 has a thickness "$T_1$" in a range from about 1 micron to about 50 microns, for example, in a range from about 3 microns to about 25 microns; in a range from about 7 microns to about 12 microns; or in a range from about 14 microns to about 18 microns.

The first ceramic-containing layer 136 provides mechanical support for the porous polymeric substrate 131. It has been found by the inventors that inclusion of the first ceramic-containing layer 136 reduces thermal shrinkage of the porous polymeric substrate 131 during processing at elevated temperatures. Thus, including the first ceramic-containing layer 136 allows for the processing of thinner separator materials at elevated temperatures.

The first ceramic-containing layer 136 includes one or more ceramic materials. The ceramic material may be an oxide. In one implementation, the first ceramic-containing layer 136 includes a material selected from, for example, aluminum oxide ($Al_2O_3$), $AlO_x$, $AlO_xN_y$, AlN (aluminum deposited in a nitrogen environment), aluminum hydroxide oxide ($(AlO(OH))$) (e.g., diaspore (($\alpha$-AlO(OH))), boehmite ($\gamma$-AlO(OH)), or akdalaite ($5Al_2O_3.H_2O$)), calcium carbonate ($CaCO_3$), titanium dioxide ($TiO_2$), $SiS_2$, $SiPO_4$, silicon oxide ($SiO_2$), zirconium oxide ($ZrO_2$), hafnium oxide ($HfO_2$), MgO, $TiO_2$, $Ta_2O_5$, $Nb_2O_5$, $LiAlO_2$, $BaTiO_3$, BN, ion-conducting garnet, ion-conducting perovskite, ion-conducting anti-perovskites, porous glass ceramic, and the like, or combinations thereof. In one implementation, the first ceramic-containing layer 136 comprises a combination of $AlO_x$ and $Al_2O_3$. In one implementation, the first ceramic-containing layer 136 comprises a material selected from the group comprising, consisting of, or consisting essentially of porous aluminum oxide, porous-$ZrO_2$, porous-$HfO_2$, porous-$SiO_2$, porous-MgO, porous-$TiO_2$, porous-$Ta_2O_5$, porous-$Nb_2O_5$, porous-$LiAlO_2$, porous-$BaTiO_3$, ion-conducting garnet, anti-ion-conducting perovskites, porous glass dielectric, or combinations thereof. In one implementation, the first ceramic-containing layer 136 contains a binder material. In some implementations, the first ceramic-containing layer 136 is a porous aluminum oxide layer. Any suitable deposition technique, which achieves the desired ion-conductivity, mechanical integrity, and thickness of the first ceramic-containing layer 136 may be used to form the first ceramic-containing layer 136. Suitable techniques include slurry deposition techniques or wet coating techniques such as slot-die techniques and doctor blade techniques. In one implementation, the first ceramic-containing layer 136 is deposited using ceramic particles dispersed in a polymeric binder to make the composite and a solvent to make the slurry. In one implementation, the first ceramic-containing layer 136 and the porous polymeric substrate 131 are prefabricated and supplied together.

In one implementation, the first ceramic-containing layer 136 has a thickness "$T_2$" in a range from about 1,000 nanometers to about 5,000 nanometers, for example, in a range from about 1,000 nanometers to about 3,000 nanometers; or in a range from about 1,000 nanometers to about 2,000 nanometers.

The second ceramic-containing layer 138 includes one or more ceramic materials. The ceramic material may be an oxide. In one implementation, the second ceramic-containing layer 138 includes a material selected from, for example, aluminum oxide ($Al_2O_3$), $AlO_x$, $AlO_xN_y$, AlN (aluminum deposited in a nitrogen environment), aluminum hydroxide oxide ($(AlO(OH))$) (e.g., diaspore (($\alpha$-AlO(OH))), boehmite ($\gamma$-AlO(OH)), or akdalaite ($5Al_2O_3.H_2O$)), calcium carbonate ($CaCO_3$), titanium dioxide ($TiO_2$), $SiS_2$, $SiPO_4$, silicon oxide ($SiO_2$), zirconium oxide ($ZrO_2$), hafnium oxide ($HfO_2$), MgO, $TiO_2$, $Ta_2O_5$, $Nb_2O_5$, $LiAlO_2$, $BaTiO_3$, BN, ion-conducting garnet, ion-conducting perovskite, ion-conducting anti-perovskites, porous glass ceramic, and the like, or combinations thereof. In one implementation, the first ceramic-containing layer 136 comprises a combination of $AlO_x$ and $Al_2O_3$. In one implementation, the second ceramic-containing layer 138 includes a material selected from the group comprising, consisting of, or consisting essentially of porous aluminum oxide, porous-$ZrO_2$, porous-$HfO_2$, porous-$SiO_2$, porous-MgO, porous-$TiO_2$, porous-$Ta_2O_5$, porous-$Nb_2O_5$, porous-$LiAlO_2$, porous-$BaTiO_3$, ion-conducting garnet, anti-ion-conducting perovskites, porous glass dielectric, or combinations thereof. The second ceramic-containing layer 138 is a binder-free dielectric layer. In some implementations, the second ceramic-containing layer 138 is a porous aluminum oxide layer. The second ceramic-containing layer 138 is typically deposited using evaporation techniques as described herein.

In one implementation, the second ceramic-containing layer 138 has a thickness "$T_3$" in a range from about 1 nanometer to about 1,000 nanometers, for example, in a range from about 50 nanometers to about 500 nanometers; or in a range from about 50 nanometers to about 200 nanometers.

In some implementations, the second ceramic-containing layer 138 includes a plurality of dielectric columnar projections. The dielectric columnar shaped projections may have a diameter that expands from the bottom (e.g., where the columnar shaped projection contacts the porous substrate) of the columnar shaped projection to a top of the columnar shaped projection. The dielectric columnar projections typically comprise dielectric grains. Nano-structured contours or channels are typically formed between the dielectric grains.

In some implementations, the second ceramic-containing layer 138 may comprise one or more of various forms of porosities. In some implementations, the columnar projections of the second ceramic-containing layer 138 form a nano-porous structure between the columnar projections of ceramic material. In one implementation, the nano-porous structure may have a plurality of nano-pores that are sized to have an average pore size or diameter less than about 10 nanometers (e.g., from about 1 nanometer to about 10 nanometers; from about 3 nanometers to about 5 nanometers). In another implementation, the nano-porous structure may have a plurality of nano-pores that are sized to have an average pore size or diameter less than about 5 nanometers. In one implementation, the nano-porous structure has a plurality of nano-pores having a diameter ranging from about 1 nanometer to about 20 nanometers (e.g., from about 2 nanometers to about 15 nanometers; or from about 5 nanometers to about 10 nanometers). The nano-porous structure yields a significant increase in the surface area of the second ceramic-containing layer 138. The pores of the nano-porous structure can act as liquid electrolyte reservoir and provides excess surface area for ion-conductivity.

In one implementation, the first ceramic-containing layer 136 and the second ceramic-containing layer 138 include the same ceramic material. In another implementation, the first ceramic-containing layer 136 and the second ceramic-containing layer 138 include different ceramic materials.

Figure 3:
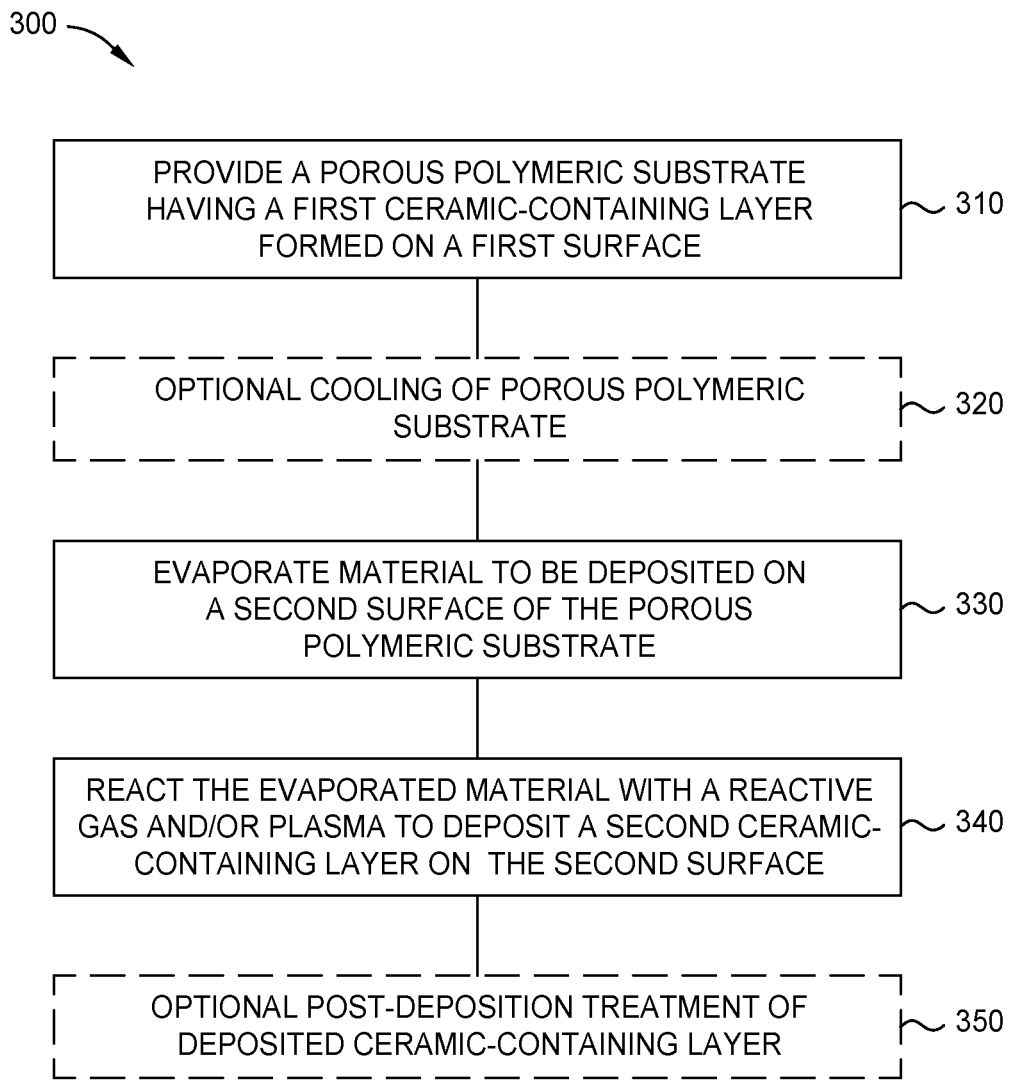
FIG. 3 illustrates a process flow chart summarizing one implementation of a method for forming an electrode structure according to implementations described herein.

FIG. 3 illustrates a process flow chart summarizing one implementation of a method 300 for forming a ceramic-coated separator according to implementations described herein. The ceramic-coated separator may be the ceramic-coated separator 130 depicted in FIG. 1 and FIG. 2.

At operation 310, a porous polymeric substrate, such as the porous polymeric substrate 131, having a first ceramic-containing layer, such as the first ceramic-containing layer 136, formed on a first surface, such as the first surface 132 of the porous polymeric substrate is provided. In one implementation, the first ceramic-containing layer 136 formed on the porous polymeric substrate 131 is prefabricated and supplied together. In another implementation, the first ceramic-containing layer 136 is formed on the porous polymeric substrate 131 using a slurry deposition process.

At operation 320, the porous polymeric substrate 131 having the first ceramic-containing layer 136 formed thereon is optionally exposed to a cooling process. In one implementation, the porous polymeric substrate 131 may be cooled to a temperature between −20 degrees Celsius and room temperature (i.e., 20 to 22 degrees Celsius) (e.g., −10 degrees Celsius and 0 degrees Celsius). In some implementations, the porous polymeric substrate 131 may be cooled by cooling the processing drum over which the microporous ion-conducting polymeric substrate travels over during processing. Other active cooling means may be used to cool the microporous ion-conducting polymeric substrate. During the evaporation process, the porous polymeric substrate 131 may be exposed to temperatures in excess of 1,000 degrees Celsius thus it is beneficial to cool the porous polymeric substrate 131 prior to the evaporation process of operation 330.

At operation 330, the material to be deposited on a second surface of the porous polymeric substrate 131 is exposed to an evaporation process to evaporate the material to be deposited in a processing region. In one implementation, the material to be evaporated is a metal or a metal oxide. In one implementation, the material to be evaporated is chosen from the group of aluminum (Al), zirconium (Zr), hafnium (Hf), niobium (Nb), tantalum (Ta), titanium (Ti), yttrium (Y), lanthanum (La), silicon (Si), boron (B), silver (Ag), chromium (Cr), copper (Cu), indium (In), iron (Fe), magnesium (Mg), calcium (Ca), strontium (Sr), barium (Ba), nickel (Ni), tin (Sn), ytterbium (Yb), lithium (Li), calcium (Ca) or combinations thereof. In another implementation, the material to be evaporated is chosen from the group of zirconium oxide, hafnium oxide, silicon oxide, magnesium oxide, titanium oxide, tantalum oxide, niobium oxide, lithium aluminum oxide, barium titanium oxide, or combinations thereof. In one implementation, the material to be deposited is a metal such as aluminum. Further, the evaporation material may also be an alloy of two or more metals. The evaporation material is the material that is evaporated during the evaporation and with which the microporous ion-conducting polymeric substrate is coated. The material to be deposited (e.g., aluminum) can be provided in a crucible. The material to be deposited, for example, can be evaporated by thermal evaporation techniques or by electron beam evaporation techniques. In another implementation, the material to be deposited is deposited using chemical vapor deposition (CVD) or atomic layer deposition (ALD) techniques. For example, in one implementation, the material to be deposited is $Al_2O_3$, which is deposited by an ALD process. In another example, the material to be deposited is $SiO_2$, which is deposited by a CVD process.

In some implementations, the material to be evaporated is fed to the crucible as a wire. In this case, the feeding rates and/or the wire diameters have to be chosen such that the desired ratio of the evaporation material and the reactive gas is achieved. In some implementations, the diameter of the feeding wire for feeding to the crucible is chosen between 0.5 mm and 2.0 mm (e.g., between 1.0 mm and 1.5 mm). These dimensions may refer to several feedings wires made of the evaporation material. In one implementation, feeding rates of the wire are in the range of between 50 cm/min and 150 cm/min (e.g., between 70 cm/min and 100 cm/min).

The crucible is heated in order to generate a vapor, which reacts with the reactive gas and/or plasma supplied at operation 340 to coat the second surface 134 of the porous polymeric substrate 131 with a second ceramic-containing layer such as the second ceramic-containing layer 138. Typically, the crucible is heated by applying a voltage to the electrodes of the crucible, which are positioned at opposite sides of the crucible. Generally, according to implementations described herein, the material of the crucible is conductive. Typically, the material used as crucible material is temperature resistant to the temperatures used for melting and evaporating. Typically, the crucible of the present disclosure is made of one or more materials selected from the group comprising, consisting of, or consisting essentially of metallic boride, metallic nitride, metallic carbide, non-metallic boride, non-metallic nitride, non-metallic carbide, nitrides, titanium nitride, borides, graphite, $TiB_2$, BN, $B_4C$, and SiC.

The material to be deposited is melted and evaporated by heating the evaporation crucible. Heating can be conducted by providing a power source (not shown) connected to the first electrical connection and the second electrical connection of the crucible. For instance, these electrical connections may be electrodes made of copper or an alloy thereof. Thereby, heating is conducted by the current flowing through the body of the crucible. According to other implementations, heating may also be conducted by an irradiation heater of an evaporation apparatus or an inductive heating unit of an evaporation apparatus.

In some implementations, the evaporation unit is typically heatable to a temperature of between 1,300 degrees Celsius and 1,600 degrees Celsius, such as 1,560 degrees Celsius. This is done by adjusting the current through the crucible accordingly, or by adjusting the irradiation accordingly. Typically, the crucible material is chosen such that its stability is not negatively affected by temperatures of that range. Typically, the speed of the porous polymeric substrate 131 is in the range of between 20 cm/min and 200 cm/min, more typically between 80 cm/min and 120 cm/min such as 100 cm/min. In these cases, the means for transporting should be capable of transporting the substrate at those speeds.

Optionally, at operation 340, the evaporated material is reacted with a reactive gas and/or plasma to form the second ceramic-containing layer, such as the second ceramic-containing layer 138, on a second surface, such as second surface 134 of the porous polymeric substrate. According to some implementations, which can be combined with other implementations described herein, the reactive gases can be selected from the group comprising, consisting of, or consisting essentially of: oxygen-containing gases, nitrogen-containing gases, or combinations thereof. Examples of oxygen-containing gases that may be used with the implementations described herein include oxygen ($O_2$), ozone ($O_3$), oxygen radicals (O*), or combinations thereof. Examples of nitrogen containing gases that may be used with the implementations described herein include $N_2$, $N_2O$, $NO_2$, $NH_3$, or combinations thereof. According to some implementations, additional gases, typically inert gases such as argon can be added to a gas mixture comprising the reactive gas. Thereby, the amount of reactive gas can be more easily controlled. According to some implementations, which can be combined with other implementations described herein, the process can be carried out in a vacuum environment with a typical atmosphere of $1*10^{-2}$ mbar to $1*10^{-6}$ mbar (e.g., $1*10^{-3}$ mbar or below; $1*10^{-4}$ mbar or below).

In some implementations where the evaporated material is reacted with plasma, the plasma is an oxygen-containing plasma. In one implementation, the oxygen-containing plasma is formed from an oxygen-containing gas and optionally an inert gas. The oxygen-containing gas may be selected from the group of $N_2O$, $O_2$, $O_3$, $H_2O$, and combinations thereof. The optional inert gas may be selected from the group of helium, argon, or combinations thereof. In one implementation, the oxygen-containing plasma is formed by a remote plasma source and delivered to the processing region to react with the evaporated material and form the second ceramic-containing layer. In another implementation, the oxygen-containing plasma is formed in-situ in the processing region and reacted with the evaporated material in the processing region to form the second-ceramic-containing layer.

In some implementations, the evaporated material is deposited directly on the second surface, such as second surface 134 of the porous polymeric substrate to form the second ceramic-containing layer, such as the second ceramic-containing layer 138. For example, in some implementations, where the material to be evaporated is a metal oxide, the material to be deposited is deposited on the second surface 134 without the optional reactive gas/plasma treatment of operation 340.

At operation 350, an optional post-deposition treatment of the deposited dielectric layer is performed. The optional post-deposition treatment may include a post-deposition plasma treatment to densify the deposited dielectric layer, additional "functionalization" processes may be performed post-deposition; for example, complete oxidation of $AlO_x$ to form $Al_2O_3$, or deposition of polymer material to enhance puncture resistance of the membrane.

Figure 4A:
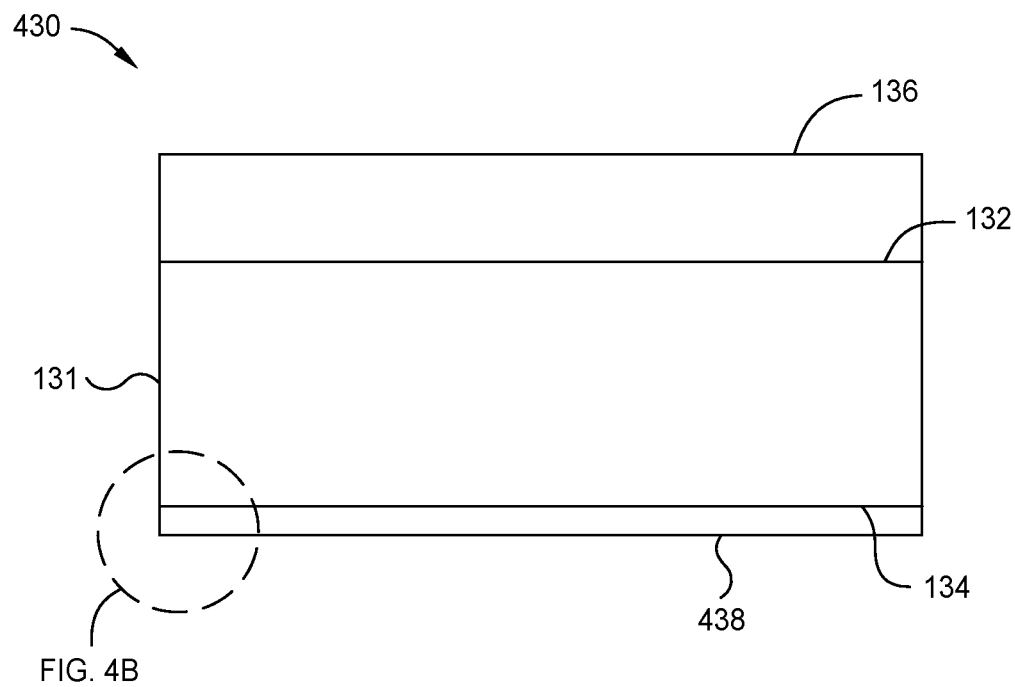
FIG. 4A illustrates a cross-sectional view of another ceramic-coated separator formed according to one or more implementations described herein.
Figure 4B:
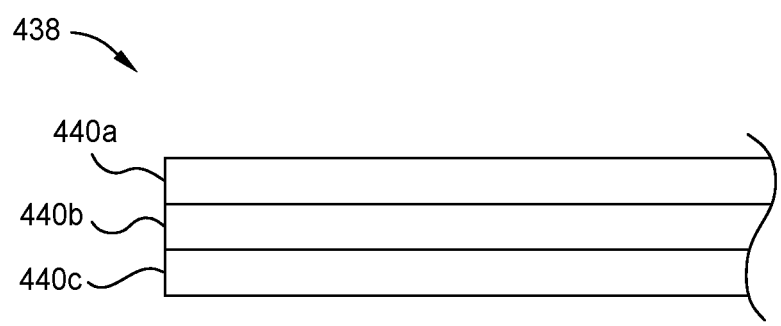
FIG. 4B illustrates an exploded cross-sectional view of a portion of the ceramic-coated separator depicted in FIG. 4A.
Figure 5:
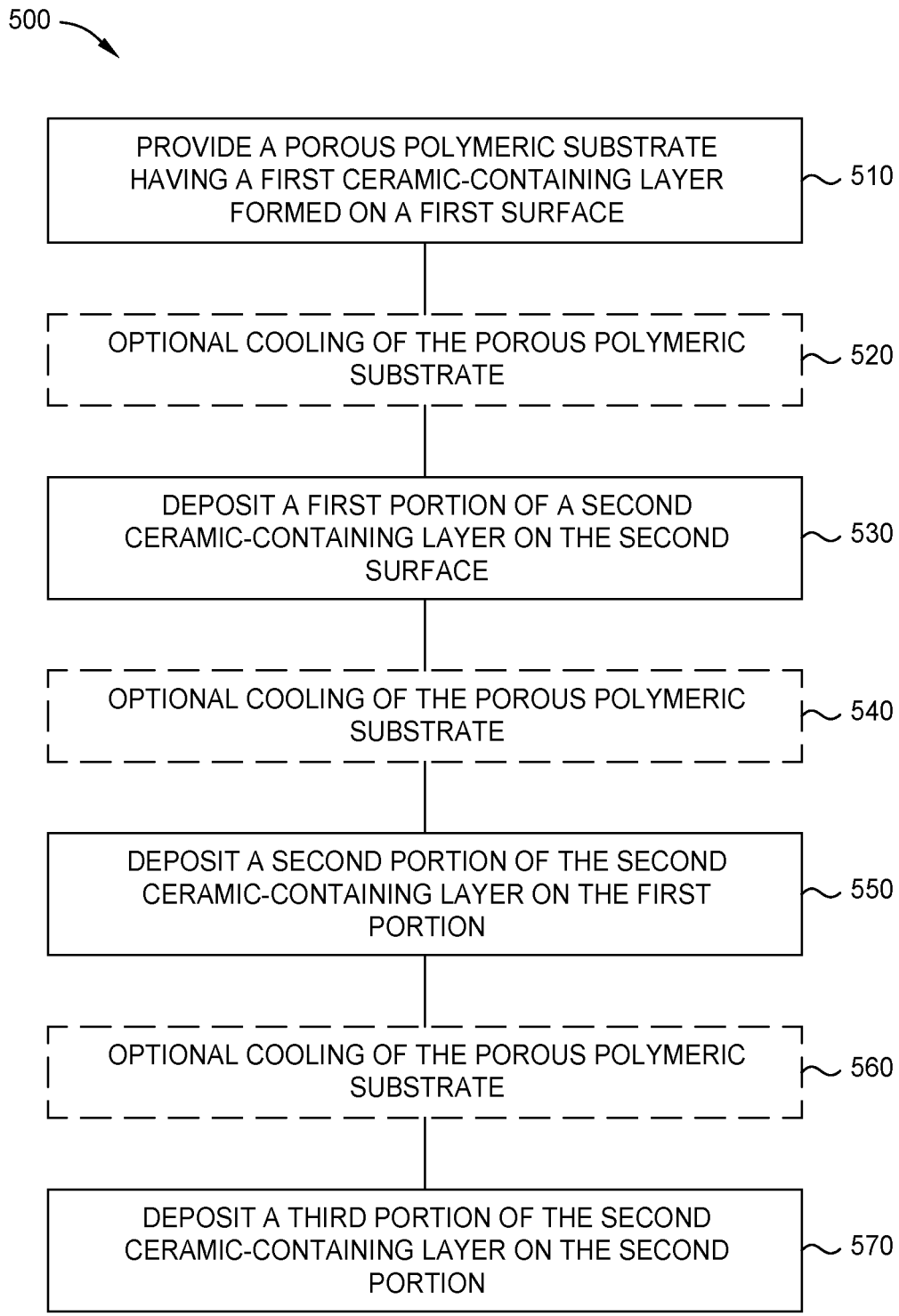
FIG. 5 illustrates a process flow chart summarizing one implementation of another method for forming a ceramic-coating separator according to implementations described herein.

FIG. 4A illustrates a cross-sectional view of another ceramic-coated separator 430 formed according to one or more implementations described herein. FIG. 4B illustrates an exploded cross-sectional view of a portion of the ceramic-coated separator 430 depicted in FIG. 4A. FIG. 5 illustrates a process flow chart summarizing one implementation of another method 500 for forming an electrode structure according to implementations described herein. The method 500 corresponds to the fabrication of the ceramic-coated separator 430 depicted in FIGS. 4A and 4B. The ceramic-coated separator 430 is similar to the ceramic-coated separator 130 except that the ceramic-coated separator 430 has a second ceramic-containing layer 438 that is formed by a multi-pass process.

At operation 510, a porous polymeric substrate, such as the porous polymeric substrate 131, having a first ceramic-containing layer, such as the first ceramic-containing layer 136, formed on a first surface, such as the first surface 132 of the porous polymeric substrate is provided.

At operation 520, the porous polymeric substrate 131 is optionally exposed to a cooling process. In one implementation, the porous polymeric substrate 131 may be cooled to a temperature between −20 degrees Celsius and room temperature (i.e., 20 to 22 degrees Celsius) (e.g., −10 degrees Celsius and 0 degrees Celsius). In some implementations, the porous polymeric substrate 131 may be cooled by cooling the processing drum over which the microporous ion-conducting polymeric substrate travels over during processing. Other active cooling means may be used to cool the microporous ion-conducting polymeric substrate. During the evaporation process, the porous polymeric substrate 131 may be exposed to temperatures in excess of 1,000 degrees Celsius thus it is beneficial to cool the porous polymeric substrate 131 prior to the evaporation process of operation 330.

At operation 530, a first portion 440a of the second ceramic-containing layer 438 is formed on the second surface 134 of the porous polymeric substrate. The first portion 440a of the second ceramic-containing layer 438 is formed via an evaporation process as described in operation 330 and/or operation 340 of FIG. 3. The first portion 440a may include any of the ceramic materials disclosed herein. In one implementation, the first portion 440a has a thickness in a range from about 1 nanometer to about 50 nanometers, for example, in a range from about 15 nanometers to about 50 nanometers; or in a range from about 20 nanometers to about 30 nanometers.

At operation 540, the porous polymeric substrate 131, having the first portion 440a of the second ceramic-containing layer 438, is optionally exposed to a cooling process. The cooling process of operation 540 may be performed similarly to the cooling process of operation 520.

At operation 550, a second portion 440b of the second ceramic-containing layer 438 is formed on the first portion 440a of the second ceramic-containing layer 438. The second portion 440b of the second ceramic-containing layer 438 is formed via an evaporation process as described in operation 330 and 340 of FIG. 3. The second portion 440b may include any of the ceramic materials disclosed herein. In one implementation, the second portion 440b has a thickness in a range from about 1 nanometer to about 50 nanometers, for example, in a range from about 15 nanometers to about 50 nanometers; or in a range from about 20 nanometers to about 30 nanometers.

At operation 560, the porous polymeric substrate 131, having the first portion 440a and the second portion 440b of the second ceramic-containing layer 438 is optionally exposed to a cooling process. The cooling process of operation 560 may be performed similarly to the cooling processes of operation 520 and operation 530.

At operation 570, a third portion 440c of the second ceramic-containing layer 438 is formed on the second portion 440b of the second ceramic-containing layer 438. The third portion 440c of the second ceramic-containing layer 438 is formed via an evaporation process as described in operations 330 and 340 of FIG. 3. The third portion 440c may include any of the ceramic materials disclosed herein. In one implementation, the third portion 440c has a thickness in a range from about 1 nanometer to about 50 nanometers, for example, in a range from about 15 nanometers to about 50 nanometers; or in a range from about 20 nanometers to about 30 nanometers.

In one implementation, the first portion 440a, the second portion 440b, and the third portion 440c comprise the same or similar ceramic materials. For example, the first portion 440a, the second portion 440b, and the third portion 440c comprise porous $AlO_x/Al_2O_3$. In another implementation, at least two of the first portion 440a, the second portion 440b, and the third portion 440c comprise different ceramic materials. For example, the first portion 440a comprises porous $AlO_x/Al_2O_3$, the second portion 440b comprises porous $SiO_2$, and the third portion 440c comprises $ZrO_2$. It should be understood that although three layers 440a-c are depicted in FIG. 4B, any number of layers may be deposited in order to achieve the desired thickness and properties of the second ceramic-containing layer 438.

Figure 6A:
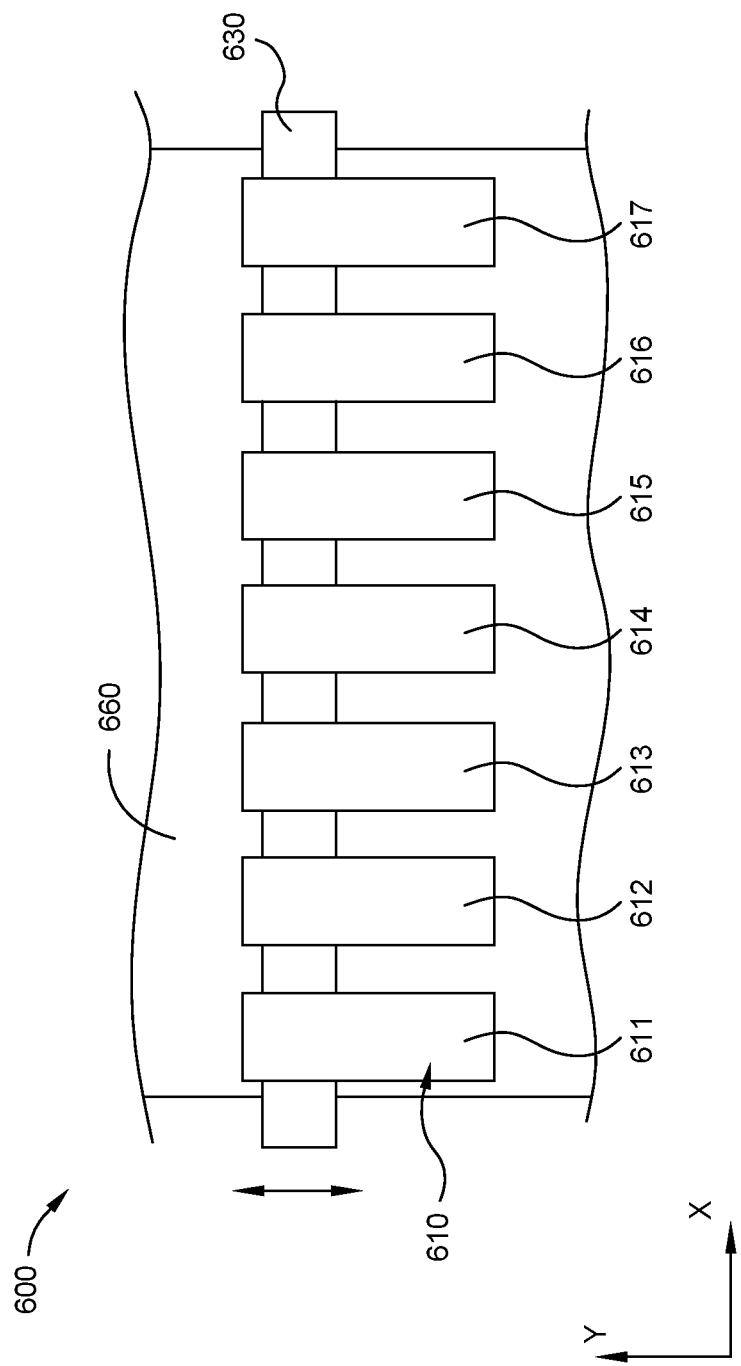
FIG. 6A illustrates a schematic top view of an evaporation apparatus for forming a ceramic-coated separator according to implementations described herein.
Figure 6B:
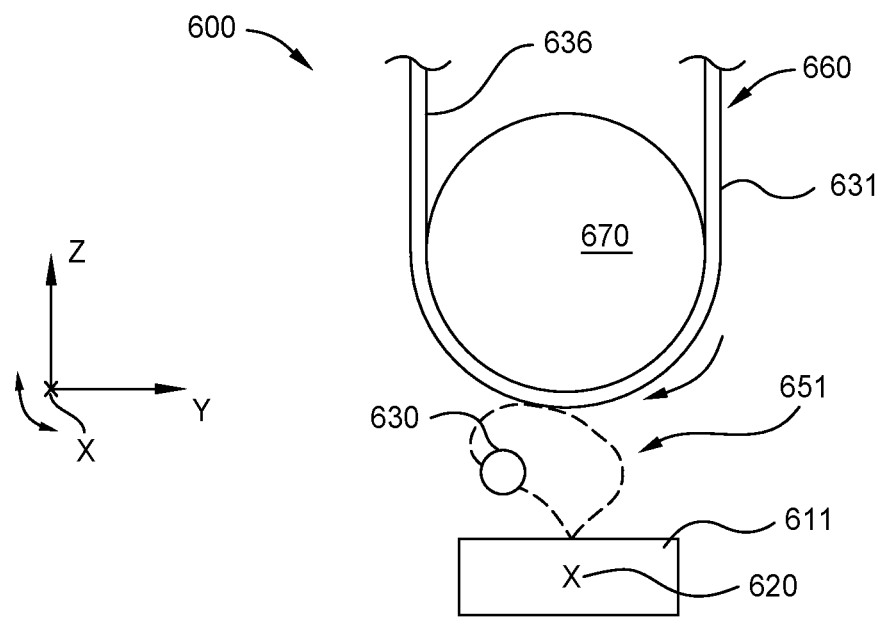
FIG. 6B illustrates a schematic front view of the evaporation apparatus shown in FIG. 6A.
Figure 6C:
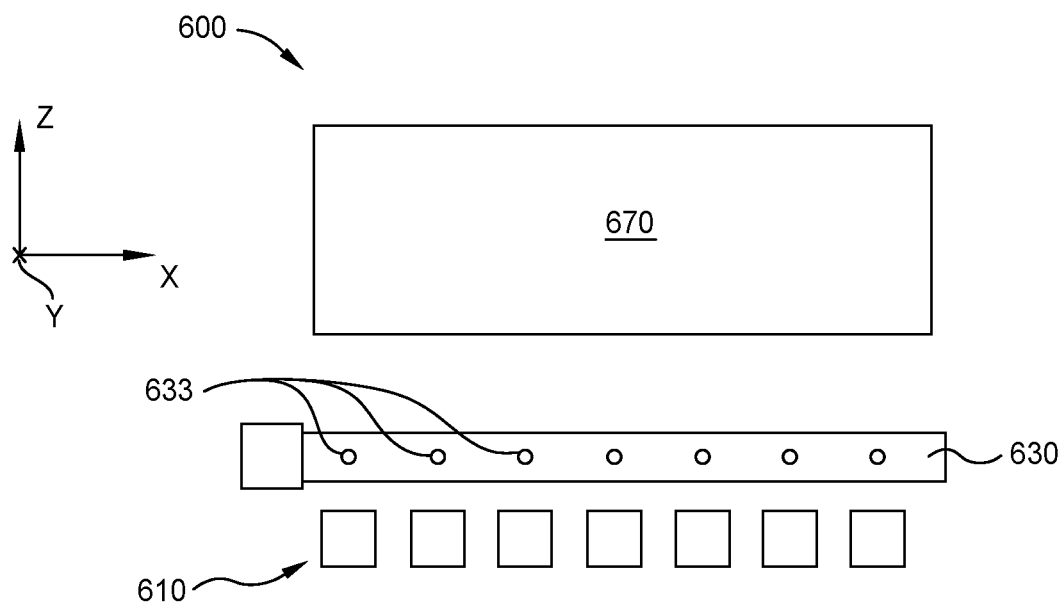
FIG. 6C illustrates a schematic top view of the evaporation apparatus shown in FIG. 6A.

FIG. 6A illustrates a schematic top view of an evaporation apparatus 600 for forming a ceramic-coated separator according to implementations described herein. FIG. 6B illustrates a schematic front view of the evaporation apparatus 600 shown in FIG. 6A. FIG. 6C illustrates a schematic top view of the evaporation apparatus 600 shown in FIG. 6A. The evaporation apparatus 600 may be used to form the ceramic-coated separator as described herein. The evaporation apparatus 600 may be used to perform the method 300 and the method 500 as described herein. For example, the evaporation apparatus may be used to deposit an ultra-thin ceramic-coating, for example, the second ceramic-containing layer 138, on a flexible conductive substrate, for example, the porous polymeric substrate 131, having a thick ceramic-containing layer 636, for example, the first ceramic-containing layer 136, formed thereon.

In some implementations, as shown in FIGS. 6A and 6B, the evaporation apparatus 600 includes a first set 610 of evaporation crucibles aligned in a first line 620 along a first direction, e.g. along the x-direction shown in FIG. 6A, for generating a cloud 651 of evaporated material to be deposited on a flexible substrate 660. In one implementation, the flexible substrate 660 includes a porous polymeric substrate 631, for example, the porous polymeric substrate 131, having a thick ceramic-containing layer 636, for example, the first ceramic-containing layer 136, formed thereon.

With exemplary reference to FIG. 1, typically the flexible substrate 660 moves in the y-direction during the deposition process. The first set 610 of evaporation crucibles shown in FIG. 6A includes crucibles 611 to 617. Further, as exemplarily shown in FIG. 6C, the evaporation apparatus 600 includes a gas supply pipe 630 extending in the first direction and being arranged between the first set 610 of evaporation crucibles and a processing drum 670. As shown in FIG. 6C, typically the gas supply pipe 630 includes a plurality of outlets 633 for providing a gas supply directed into the cloud 651 of evaporated material. Further, as indicated by the double arrows in FIG. 6B, the evaporation apparatus is configured such that a position of the plurality of outlets is adjustable for changing a position of the gas supply directed into the cloud 651 of evaporated material.

Accordingly, it is to be understood that the evaporation apparatus 600 as described herein may be an evaporation apparatus for a reactive evaporation process. In some implementations, the herein described crucibles may be adapted for providing evaporated material on the substrate to be coated. For example, the crucibles may provide one component of the material to be deposited as a layer on the substrate. In particular, the crucibles described herein may include a metal, e.g. aluminum, which is evaporated in the crucibles. Further, the evaporated material from the crucibles may react with a further component, e.g. a reactive gas such as oxygen and/or a plasma such as an oxygen-containing plasma, in the evaporation apparatus for forming a ceramic-containing layer as described herein on the flexible substrate. Accordingly, the aluminum from the crucibles together with the oxygen and/or oxygen-containing plasma as described herein may form a layer of AlOx, $Al_2O_3$, and/or a mixed layer of $Al_2O_3/AlO_x$ on the flexible substrate in the evaporation apparatus according to implementations described herein. In view of the implementations described herein, the skilled person understands that any material, specifically any metal, may be used as material in the crucibles as long as the vapor pressure of the material may be achieved by thermal evaporation.

During processing, the flexible substrate 660 is subjected to the material evaporated by the crucible set 610 as indicated by the cloud 651 of evaporated material, as exemplarily shown in FIG. 6B. Further, during processing, a gas supply and/or plasma is directed into the cloud 651 of evaporated material, such that a portion of the evaporated material may react with the supplied gas and/or plasma. Accordingly, the flexible substrate 660 is further subjected to evaporated material, which has been reacted with the supplied gas and/or plasma such that during processing, the flexible substrate 660 is coated with a layer including the material evaporated by the crucibles and the supplied gas and/or plasma, for example, in the form of reactive products of the components provided by the crucible and the gas supply pipe.

In summary, some of the benefits of the present disclosure, include the efficient formation of a thin polymer separator stack. The thin polymer separator stack includes an ultra-thin ceramic coating formed on a first side of front side of the thin polymer separator, which suppresses thermal shrinkage while maintaining the desired ionic conductivity. The ultra-thin ceramic coating may be deposited using PVD techniques at elevated temperatures. The thin polymer separator stack further includes a thick ceramic coating formed on a second side or backside of the of the thin polymer separator, which provides mechanical stability while maintaining the desired ionic conductivity. Thus, the thin polymer separator stack includes the benefit of reduced thermal shrinkage with improved mechanical stability while maintaining desired ionic conductivity at a decreased separator thickness (e.g., 12 microns or less).

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

The term "about" generally indicates within ±0.5%, 1%, 2%, 5%, or up to ±10% of the indicated value. For example, a pore size of about 10 nm generally indicates in its broadest sense 10 nm±10%, which indicates 9.0-11.0 nm. In addition, the term "about" can indicate either a measurement error (i.e., by limitations in the measurement method), or alternatively, a variation or average in a physical characteristic of a group (e.g., a population of pores).

The term "crucible" as used herein shall be understood as a unit capable of evaporating material that is fed to the crucible when the crucible is heated. In other words, a crucible is defined as a unit adapted for transforming solid material into vapor. Within the present disclosure, the term "crucible" and "evaporation unit" are used synonymously.

The term "processing drum" as used herein shall be understood as a roller, which is used during processing of a flexible substrate as described herein. In particular, a "processing drum" is to be understood as a roller, which is configured to support a flexible substrate during processing. More specifically, the processing drum as described herein may be arranged and configured such that the flexible substrate, e.g. a foil or a web, is wound around at least a part of the processing drum. For instance, during processing, typically the flexible substrate is in contact with at least a lower portion of the processing drum. In other words, during processing, the flexible substrate is wound around the processing drum such that the flexible substrate is in contact with a lower portion of the processing drum and the flexible substrate is provided below the processing drum.

The term "gas supply pipe" is to be understood as a pipe arranged and configured for providing a gas supply into a space between an evaporation crucible, particularly a set of evaporation crucibles, and a processing drum. For instance, the gas supply pipe may be positioned and/or shaped to direct a gas supply into a cloud of evaporated material between a first set of evaporation crucibles and the processing drum. Typically, the gas supply pipe includes openings or outlets, which are arranged and configured such that the gas supply from the gas supply pipe can be directed into the cloud of evaporated material. For instance, the openings or outlets may have at least one shape selected from the group consisting of a circular shape, a rectangular shape, an oval shape, a ring-like shape, a triangular-like shape, a polygon-like shape, or any shape suitable for delivering gas into the cloud of evaporated material.

While the foregoing is directed to implementations of the present disclosure, other and further implementations of the disclosure may be devised without departing from the basic scope thereof, and the scope thereof is determined by the claims that follow.

The invention claimed is:

1. A method of forming a separator for a battery, comprising:
   exposing a first material to be deposited on a microporous ion-conducting polymeric layer positioned in a processing region to an evaporation process, wherein the microporous ion-conducting polymeric layer has:
   a first surface;
   a second surface opposing the first surface; and
   a first ceramic-containing layer, capable of conducting ions, formed on the first surface, wherein the first ceramic-containing layer is prepared by a slot-die technique or a doctor blade technique and has a thickness in a range from about 1,000 nanometers to about 5,000 nanometers;
   reacting the evaporated first material with a reactive gas and/or plasma to deposit a second ceramic-containing layer, capable of conducting ions, on the second surface of the microporous ion-conducting polymeric layer, wherein the second ceramic-containing layer consists essentially of aluminum oxide and/or lithium aluminum oxide, is a binder-free ceramic-containing layer, and has a thickness in a range from about 1 nanometer to about 1,000 nanometers; and then
   reacting an evaporated second material with a second reactive gas and/or plasma to deposit a third ceramic-containing layer, capable of conducting ions, on the second ceramic-containing layer, wherein the third ceramic-containing layer comprises silicon oxide, is binder-free and has a thickness in a range from about 1 nanometer to about 100 nanometers.

2. The method of claim 1, wherein the first ceramic-containing layer comprises a material selected from porous aluminum oxide, porous-$ZrO_2$, porous-$HfO_2$, porous-$SiO_2$, porous-MgO, porous-$TiO_2$, porous-$Ta_2O_5$, porous-$Nb_2O_5$, porous-$LiAlO_2$, porous-$BaTiO_3$, ion-conducting garnet, anti-ion-conducting perovskites, or combinations thereof.

3. The method of claim 1, wherein the first ceramic-containing layer comprises a binder.

4. The method of claim 1, wherein the first material to be deposited is a metallic material comprising aluminum.

5. The method of claim 1, wherein the first material to be evaporated is a metal oxide comprising lithium aluminum oxide.

6. The method of claim 1, further comprising reacting an evaporated third material with a third reactive gas and/or plasma to deposit a fourth ceramic-containing layer, capable of conducting ions, on the third ceramic-containing layer, wherein the fourth ceramic-containing layer comprises zirconium oxide, is binder-free and has a thickness in a range from about 1 nanometer to about 100 nanometers.

7. The method of claim 1, further comprising exposing the microporous ion-conducting polymeric layer to a cooling process prior to exposing the first material to the evaporation process.

8. The method of claim 7, wherein the cooling process cools the microporous ion-conducting polymeric layer to a temperature of about −20° C. to about 22° C.

9. The method of claim 8, wherein the cooling process cools the microporous ion-conducting polymeric layer to a temperature of about −10° C. to about 0° C.

10. The method of claim 1, wherein the reactive gas is an oxygen-containing gas selected from oxygen ($O_2$), ozone, oxygen radicals, or combinations thereof.

11. The method of claim 1, wherein the plasma is an oxygen-containing plasma.

12. The method of claim 1, wherein the evaporation process is a thermal evaporation process or an electron beam evaporation process.

13. The method of claim 1, wherein the evaporation process comprises exposing the first material to be deposited to a temperature of about 1,300° C. to about 1,600° C.

14. The method of claim 1, wherein the microporous ion-conducting polymeric comprises polyethylene or polypropylene.

15. The method of claim 1, wherein the microporous ion-conducting polymeric has a thickness of about 1 μm to about 25 μm.

16. A method of forming a separator for a battery, comprising:
   exposing a microporous ion-conducting polymeric layer to a first cooling process;
   exposing a first material to be deposited on the microporous ion-conducting polymeric layer positioned in a processing region to an evaporation process, wherein the microporous ion-conducting polymeric layer has:
   a first surface;
   a second surface opposing the first surface; and
   a first ceramic-containing layer, capable of conducting ions, formed on the first surface, wherein the first ceramic-containing layer is prepared by a slot-die technique or a doctor blade technique and has a thickness in a range from about 1,000 nanometers to about 5,000 nanometers;
   reacting the evaporated first material with a reactive gas and/or plasma to deposit a second ceramic-containing layer, capable of conducting ions, on the second surface of the microporous ion-conducting polymeric layer, wherein the second ceramic-containing layer consists essentially of aluminum oxide and/or lithium aluminum oxide;
   exposing the microporous ion-conducting polymeric layer to a second cooling process after depositing the second ceramic-containing layer; and then reacting an evaporated second material with a second reactive gas and/or plasma to deposit a third ceramic-containing layer, capable of conducting ions, on the second ceramic-containing layer, wherein the third ceramic-containing layer comprises silicon oxide and is binder-free.

17. The method of claim 16, wherein the second ceramic-containing layer has a thickness in a range from about 1 nanometer to about 1,000 nanometers and the third ceramic-containing layer has a thickness in a range from about 1 nanometer to about 100 nanometers.

18. The method of claim 16, further comprising exposing the microporous ion-conducting polymeric layer to a third cooling process after depositing the third ceramic-containing layer.

19. The method of claim 18, further comprising reacting an evaporated third material with a reactive gas and/or plasma to deposit a fourth ceramic-containing layer, capable of conducting ions, on the third ceramic-containing layer, wherein the fourth ceramic-containing layer comprises zirconium oxide, is binder-free, and has a thickness in a range from about 1 nanometer to about 100 nanometers.

20. A method of forming a separator for a battery, comprising:
    exposing a first material to be deposited on a microporous ion-conducting polymeric layer positioned in a processing region to an evaporation process, wherein the microporous ion-conducting polymeric layer has:
        a first surface;
        a second surface opposing the first surface; and
        a first ceramic-containing layer, capable of conducting ions, formed on the first surface, wherein the first ceramic-containing layer is prepared by a slot-die technique or a doctor blade technique and has a thickness in a range from about 1,000 nanometers to about 5,000 nanometers;
    reacting the evaporated first material with a reactive gas and/or plasma to deposit a second ceramic-containing layer, capable of conducting ions, on the second surface of the microporous ion-conducting polymeric layer, wherein the second ceramic-containing layer comprises porous aluminum oxide, is a binder-free ceramic-containing layer, and has a thickness in a range from about 1 nanometer to about 1,000 nanometers; then
    reacting an evaporated second material with a second reactive gas and/or plasma to deposit a third ceramic-containing layer, capable of conducting ions, on the second ceramic-containing layer, wherein the third ceramic-containing layer comprises porous silicon oxide, is binder-free and has a thickness in a range from about 1 nanometer to about 100 nanometers; and then
    reacting an evaporated third material with a reactive gas and/or plasma to deposit a fourth ceramic-containing layer, capable of conducting ions, on the third ceramic-containing layer, wherein the fourth ceramic-containing layer comprises zirconium oxide, is binder-free, and has a thickness in a range from about 1 nanometer to about 100 nanometers.

* * * * *